(12) United States Patent
Grace

(10) Patent No.: US 6,560,160 B1
(45) Date of Patent: May 6, 2003

(54) MULTI-PORT MEMORY THAT SEQUENCES PORT ACCESSES

(75) Inventor: James W. Grace, Los Altos Hills, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/712,409

(22) Filed: Nov. 13, 2000

(51) Int. Cl.[7] ................................................ G11C 8/00
(52) U.S. Cl. ............. 365/230.05; 365/221; 365/230.09; 365/239
(58) Field of Search ........................ 365/230.05, 230.08, 365/189.05, 221, 230.02, 230.06, 230.09, 239

(56) References Cited

U.S. PATENT DOCUMENTS

| | | | |
|---|---|---|---|
| 5,260,905 A | * | 11/1993 | Mori ...................... 365/230.05 |
| 5,276,650 A | | 1/1994 | Kubota ................... 365/189.02 |
| 5,287,322 A | | 2/1994 | Rastegar ................. 365/230.05 |
| 5,289,432 A | | 2/1994 | Dhong et al. ........... 365/230.05 |
| 5,440,523 A | * | 8/1995 | Joffe .................... 365/230.058 |
| 5,475,649 A | * | 12/1995 | Balistreri et al. ....... 365/230.02 |
| 5,524,098 A | * | 6/1996 | Holland et al. .............. 365/219 |
| 5,579,278 A | * | 11/1996 | McLaury ............... 365/230.05 |
| 5,617,367 A | * | 4/1997 | Holland et al. .............. 365/219 |
| 5,659,518 A | * | 8/1997 | McLaury ............... 365/230.05 |
| 5,802,580 A | * | 9/1998 | McAlpine .................... 711/149 |
| 5,815,432 A | | 9/1998 | Naffziger et al. ........... 365/154 |
| 5,946,262 A | * | 8/1999 | Randolph et al. ...... 365/230.05 |

* cited by examiner

Primary Examiner—David Nelms
Assistant Examiner—Gene N. Auduong

(57) ABSTRACT

A multi-port memory with an array that is implemented without the additional signal lines and transistors usually found in prior multi-port memories. The multi-port memory includes a port control circuit that senses accesses from different ports and sequences the accesses to the array. The multi-port memory also includes an input/output structure for holding data associated with the accesses as they are sequenced.

28 Claims, 5 Drawing Sheets

MULTI-PORT MEMORY THAT SEQUENCES PORT ACCESSES

BACKGROUND OF THE INVENTION

1. Field of Invention

The present invention pertains to the field of memories. More particularly, this invention relates to a multi-port memory that sequences port accesses.

2. Art Background

A typical memory such as a static random access memory (SRAM) includes an array of memory cells arranged into rows and columns. Such an array usually includes word lines coupled to rows of the memory cells and bit lines coupled to columns of the memory cells. The word lines are typically used to activate the rows of the memory cells and the bit lines are usually used to read and write the memory cells that are activated by the word lines.

Such a memory may be arranged as a single-port memory or a multi-port memory. A typical single-port memory provides physical connections for only a single set of address/data lines. A typical multi-port memory provides connections for multiple separate sets of address/data lines. A common example of multi-port memory is a dual-port memory. Typically, a dual-port memory has the advantage of providing read and/or write access to stored data from two independent ports having independent timing with respect to one another.

Unfortunately, multi-port memories usually suffer from a variety of drawbacks. For example, the array in a typical prior multi-port memory includes extra word lines and bits lines in comparison to arrays in typical single-port memories. In addition, the memory cells in typical prior multi-port memories includes extra transistors in comparison to the memory cells in single-port memories. Such extra signal lines and transistors usually increase the circuit area and thereby increase manufacturing costs and decrease storage density. Moreover, the extra transistors and signal lines usually increase the power consumption of prior multi-port memories in comparison to single-port memories. Furthermore, the extra signal lines usually increase capacitance and noise in prior multi-port memories.

SUMMARY OF THE INVENTION

A multi-port memory is disclosed that sequences port accesses to an array of memory cells. The sequencing of port accesses enables the array to be implemented without the additional signal lines and transistors usually found in prior multi-port memories. The multi-port memory includes a port control circuit that senses accesses from different ports and that sequences the accesses as appropriate. The multi-port memory also includes an input/output structure for holding data associated with the sequenced accesses.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
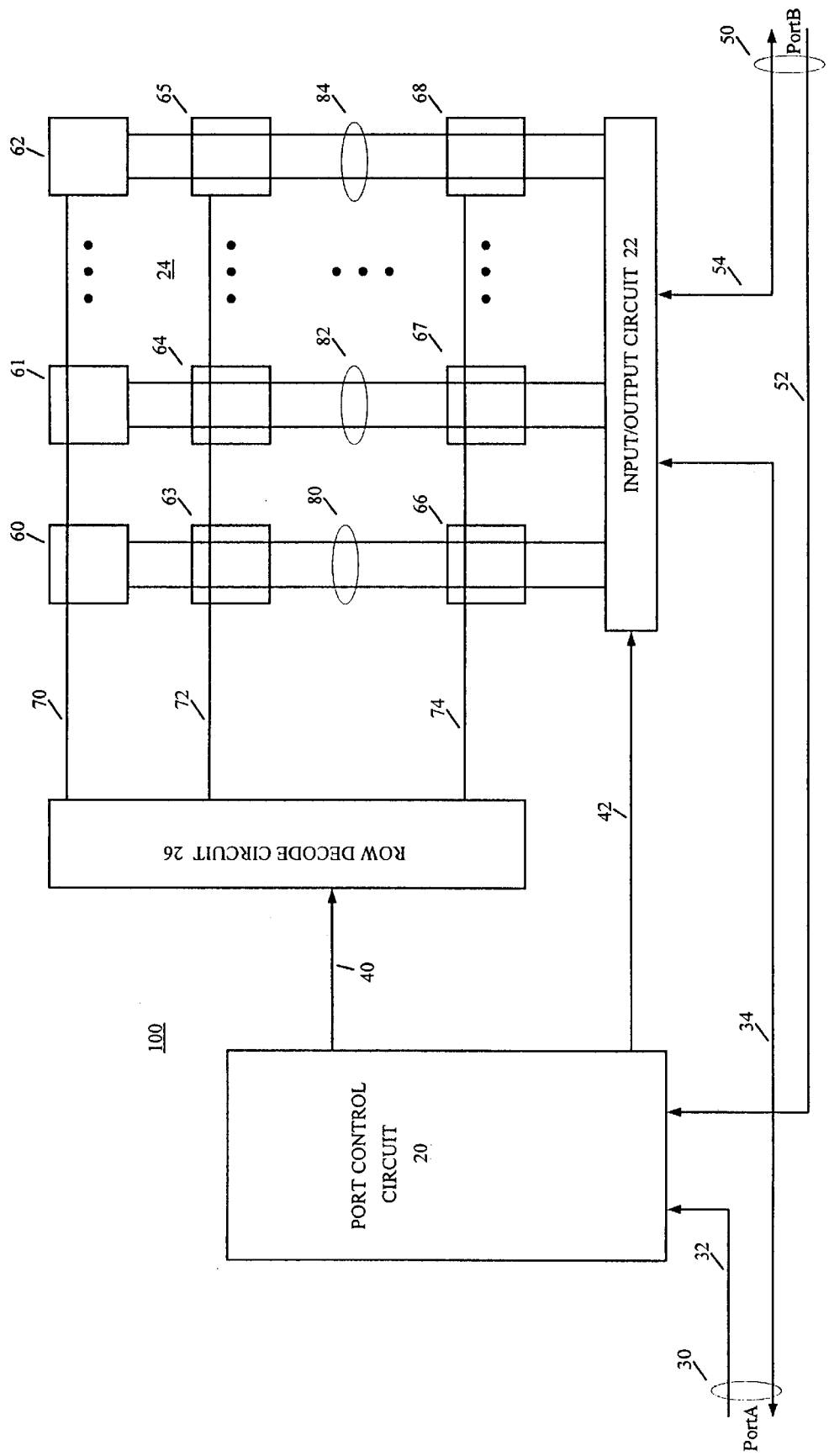
FIG. 1 shows one embodiment of a multi-port memory according to the present teachings.

FIG. 1 shows one embodiment of a multi-port memory 100 according to the present teachings. The multi-port memory 100 includes an array 24 which is structured without the additional elements usually found in prior arrays that provide multi-port access. In this embodiment, the multi-port memory 100 is a dual-port memory and the array 24 has a structure similar to that of a single-port memory. Nevertheless, a three or four, etc., port memory may be implemented in a manner consistent with the present teachings.

The ports of the multi-port memory 100 in this embodiment include a port 30 (PortA) and a port 50 (PortB). PortA includes an address/control path 32 and a data path 34. PortB includes an address/control path 52 and a data path 54. The array 24 includes a set of memory cells 60–68, a set of word lines 70–74, and sets of bit lines 80–84. The multi-port memory 100 includes a port control circuit that sequences accesses from PortA and PortB to the array 24.

The word lines 70–74 enable selection of rows of the memory cells 60–68 for sequenced PortA and PortB accesses. The word lines 70–74 are driven by a row decode circuit 26 which selects appropriate rows of the array 24 in response to a set of control signals 40 from the port control circuit 20. The control signals 40 carry row addresses associated with the sequenced PortA and PortB accesses.

Each row of the memory cells 60–68 is selected using a corresponding word line 70–74. For example, the memory cells 60–62 are selected using the word line 70 which provides a single WL select signal line for the corresponding row of the array 24 for sequenced PortA and PortB accesses. This is in contrast to prior multi-port arrays in which separate WL select signal lines are usually provided for each port, thereby multiplying the word lines in each row of an array in comparison to the array 24.

The bit lines 80–84 enable reading of data from and writing of data to the memory cells 60–68 for sequenced PortA and PortB accesses. The bit lines 80–84 are sensed during read operations by an input/output circuit 22 that senses appropriate columns of the array 24 in response to a set of control signals 42 from the port control circuit 20. In addition, the appropriate bit lines 80–84 are driven during write operations by the input/output circuit 22 in response to the control signals 42 from the port control circuit 20.

Each column of the memory cells 60–68 is accessed using a corresponding pair of the bit lines 80–84. For example, the memory cells 60, 63, and 66 are read and written using the bit lines 80 which provide a BL and a #BL line for the corresponding column of the array 24 for sequenced PortA and Port B accesses. This is in contrast to those prior multi-port arrays in which separate BL and #BL lines are usually provided for each port, thereby multiplying the bit lines in each column of an array in comparison to the array 24.

Figure 2:
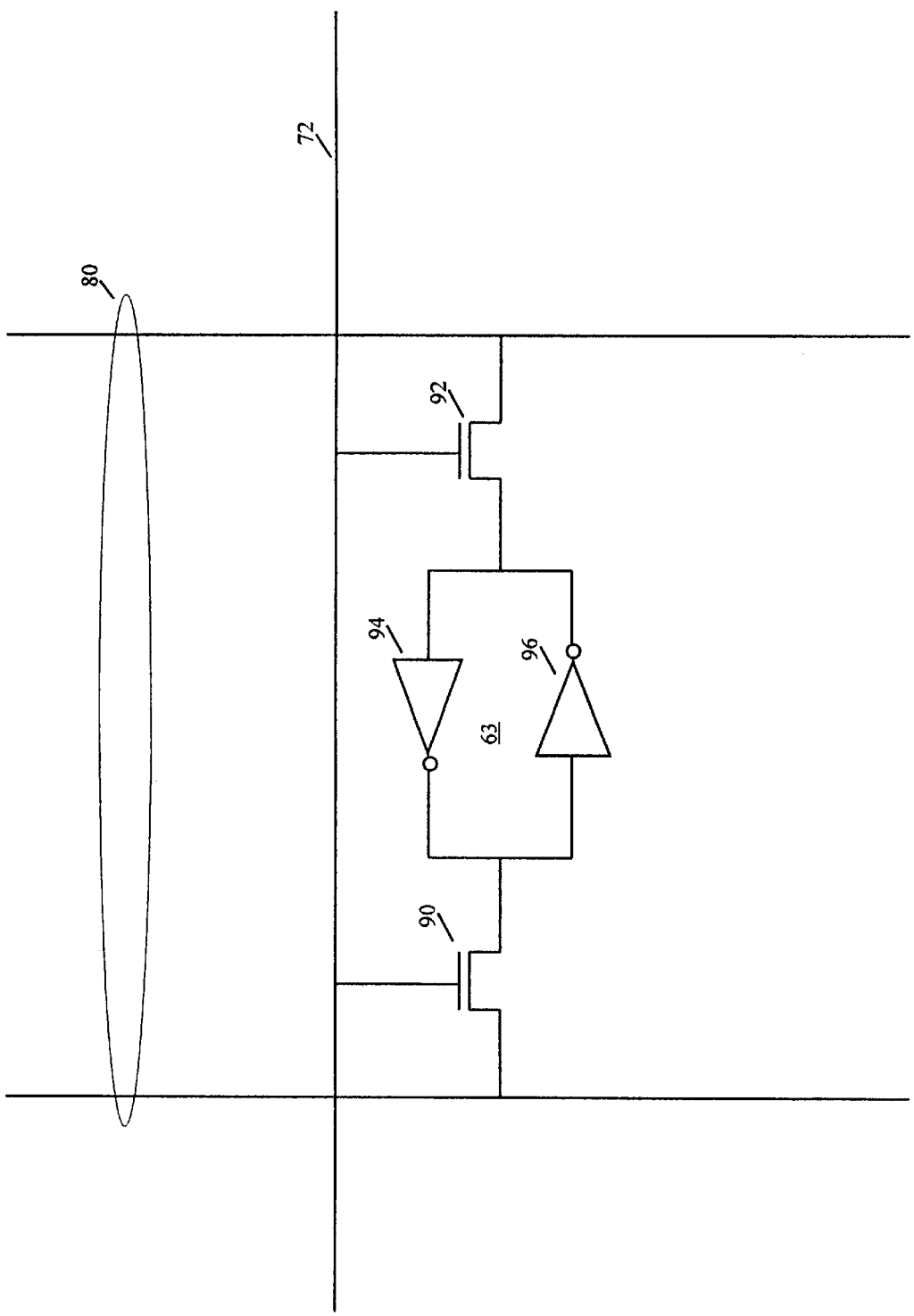
FIG. 2 shows an example of a memory cell in a multi-port memory that sequences accesses.

FIG. 2 shows an example of a memory cell, the memory cell 63, in the array 24. In this embodiment, the array 24 is an array of SRAM cells. The memory cell 63 includes a pair of invertors 94 and 96 and a pair of transistors 90 and 92 that enable selection via the word line 70 and read/write access via the bit lines 80. The transistors 90 and 92 are activated by a selection signal on the word line 72. The memory cell 63 does not include additional transistors or additional bit lines or word lines that are usually found in prior multi-port memory cells.

Figure 3:
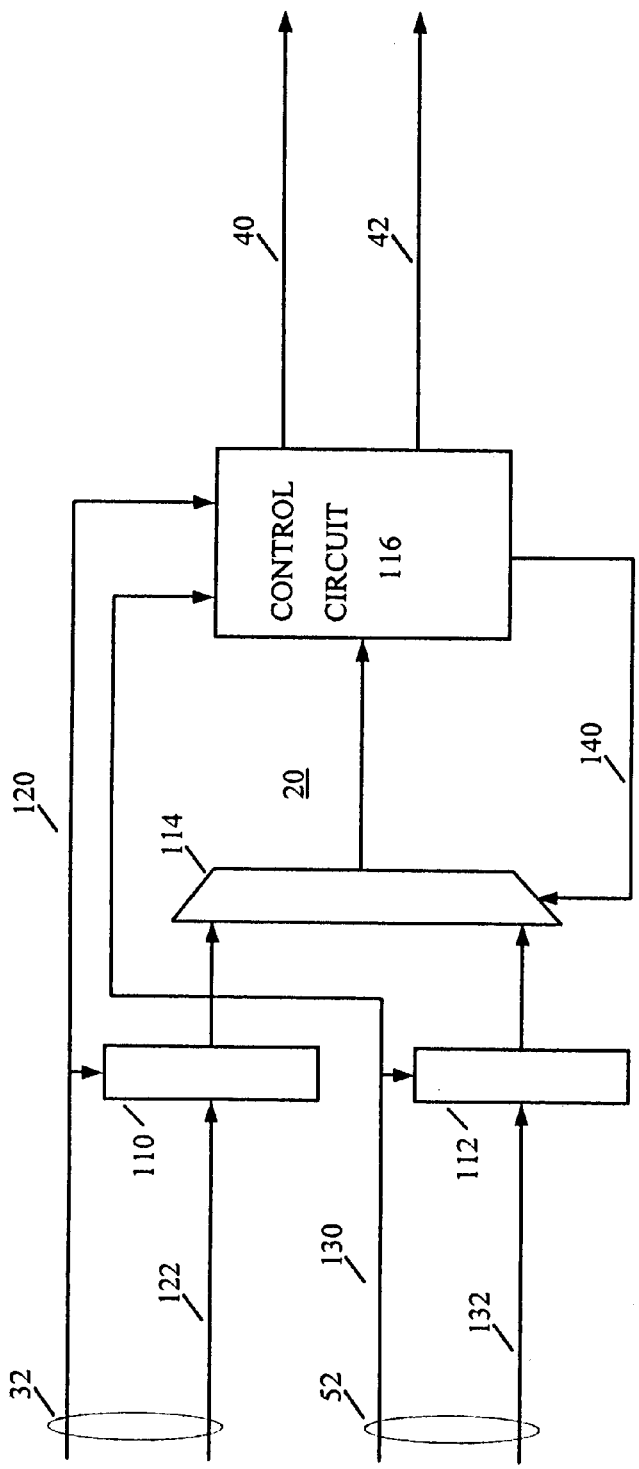
FIG. 3 shows a port control circuit in one embodiment of a multi-port memory that sequences accesses.

FIG. 3 shows the port control circuit 20 in one embodiment. The port control circuit 20 includes a pair of address latches 110 and 112 which correspond to PortA and PortB, respectively. Other embodiments having additional ports may include additional address latches.

The address latch 110 latches an address 122 (PortA_Address) carried on the Port A address/control path 32 in response to a clock signal (PortA_Clock) which is carried on a control portion 120 of the address/control path 32. The address latch 112 latches an address 132 (PortB_Address) carried on the Port B address/control path 52 in response to a clock signal (PortB_Clock) which is carried on a control portion 130 of the address/control path 52.

The port control circuit 20 includes a control circuit 116 that detects the occurrences of PortA and PortB accesses, i.e. read and/or write cycles, by sensing the states of control signals on the control portions 120 and 130. For example, the control portion 120 may include a read (RD) and/or a write (WR) signal that indicates PortA read and/or write cycles. Similarly, the control portion 130 may include a read (RD) and/or a write (WR) signal that indicates PortB read and/or write cycles. While the addresses for any PortA and PortB reads and/or write cycles are held in the address latches 110–112, the control circuit 116 sequences those reads and/or writes as appropriate to the array 24 via the control signals 40 and 42. The control circuit 116 selects the appropriate latched addresses in the address latches 110–112 to be applied to the array 24 using a multiplexor 114 which is controlled by a control signal 140.

Figure 4:
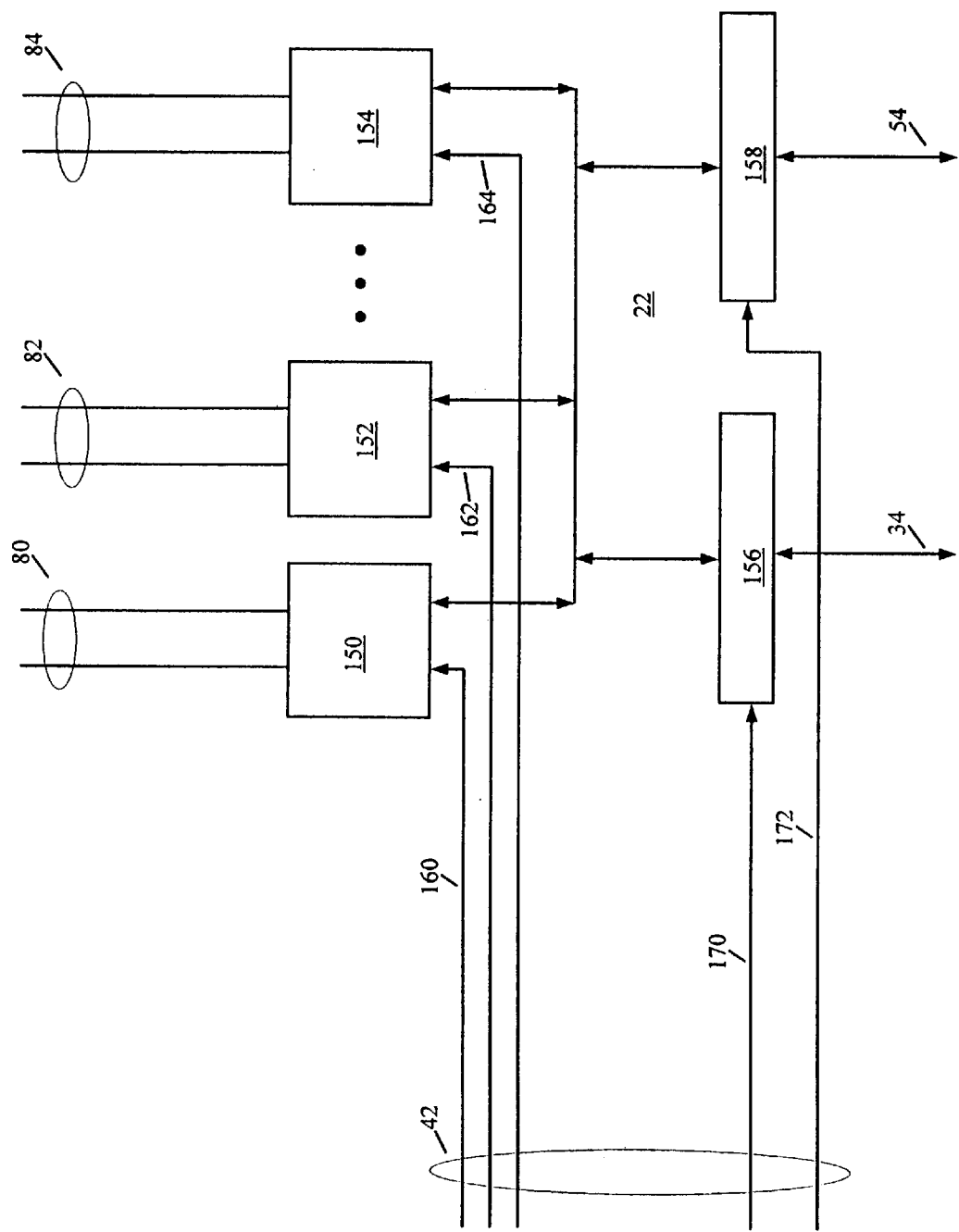
FIG. 4 shows an input/output circuit in one embodiment of a multi-port memory that sequences accesses.

FIG. 4 shows the input/output circuit 22 in one embodiment. The input/output circuit 22 includes a set of circuits 150–154. Each circuit 150–154 includes sense amplifiers and line drivers for the corresponding set of bit lines 80–84. The input/output circuit 22 includes a latch 156 for holding read/write data for PortA and a latch 158 for holding read/write data for PortB. Other embodiments having additional ports may include additional latches for holding read/write data.

For a sequenced PortA write operation, the control circuit 116 issues a set of control signals 170 to latch data on the data path 34 into the latch 156. The control circuit 116 then issues the control signals 170 to provide latched data from the latch 156 to the circuits 150–154. The control circuit 116 then issues a set of control signals 160–164 to enable line drivers in the circuits 150–154 for the appropriate columns of the array 24 depending on the address of the PortA write operation being sequenced by the control circuit 116.

For a sequenced PortB write operation, the control circuit 116 issues a set of control signals 172 to latch data on the data path 54 into the latch 158. The control circuit 116 then issues the control signals 172 to provide latched data from the latch 158 to the circuits 150–154 and then issues the control signals 160–164 to enable line drivers in the circuits 150–154 for the appropriate columns of the array 24 depending on the address of the PortB write operation.

The timing of the control signals 170 and 172 that latch data from the data paths 34 and 54 may be derived from the PortA_Clock and PortB_Clock, respectively.

For a sequenced PortA read operation, the control circuit 116 issues the control signals 160–164 to enable sense amplifiers in the circuits 150–154 for the appropriate columns of the array 24. The control circuit 116 then issues the control signals 170 to latch data sensed by the circuits 150–154 into the latch 156 where it is held for subsequent transfer via the data path 34. For a sequenced PortB read operation, the control circuit 116 issues the control signals 160–164 to enable sense amplifiers in the circuits 150–154 for the appropriate columns of the array 24 and then issues the control signals 172 to latch data sensed by the circuits 150–154 into the latch 158 where it is held for subsequent transfer via the data path 54.

Figure 5:
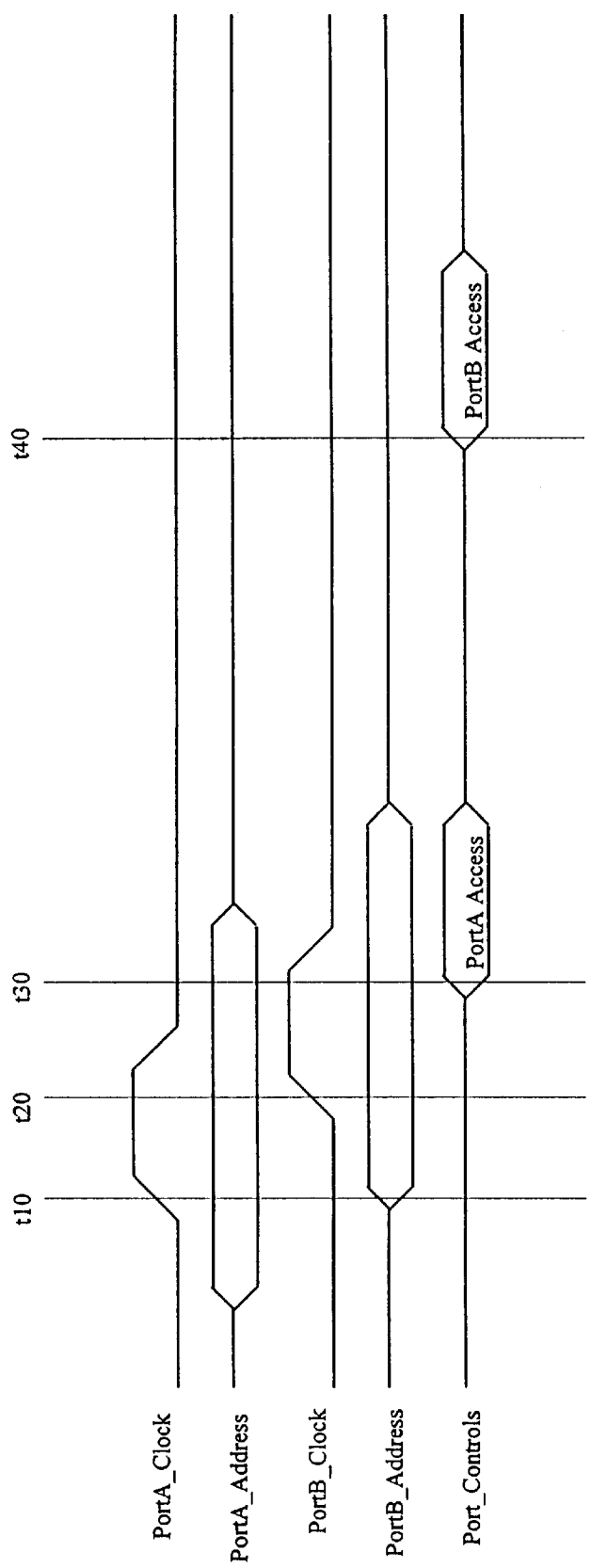
FIG. 5 illustrates the timing of an example sequence of PortA and PortB accesses.

FIG. 5 illustrates the timing of sequenced PortA and PortB accesss to the array 24. The timing of the PortA_Clock and PortA_address and the PortB_Clock and PortB_address are illustrated along with the control signals 40–42 (Port_Controls).

In this example, the PortA access is received from PortA starting at time t10 with the assertion of the PortA_Clock and the PortB access is received from PortB starting at time t20 with the assertion of the PortB_Clock. The PortA_address is latched into the address latch 110 at time t10 and the PortB_address is latched into the address latch 112 at time t20.

At time t10, the control circuit 116 detects the PortA access from signals on the control portion 120 and then at time t20 detects the PortB access from signals on the control portion 130. After time t10, the control circuit 116 issues the control signal 140 to select the address held in the address latch 110 since the PortA access was received first. At time t30, the control circuit 116 asserts the Port_Controls as appropriate to carry out the PortA access. During the PortA access, the PortB access is held waiting for completion of the PortA access. After completion of the PortA access, the control circuit 116 issues the control signal 140 to select the address held in the address latch 112 and then at time t40 asserts the Port_Controls as appropriate to carry out the PortB access.

Assume in this example that the PortA access is a read and the PortB access is a read. At time t30, the control circuit 116 asserts the control signals 40 to carry the row portion of the address obtained from the address latch 110 to the row decode circuit 26 and asserts the control signals 160–164 to enable the appropriate sense amplifiers in the circuits 150–154 in response to the address obtained from the address latch 110. After time t30, the control circuit 116 asserts the control signals 170 to latch the data obtained from the array 24 into the latch 156. The latched data is then available on the data path 34 for PortA. At time t40 after completion of the PortA read, the control circuit 116 asserts the control signals 40 to carry the row portion of the address obtained from the address latch 112 to the row decode circuit 26 and asserts the control signals 160–164 to enable the appropriate sense amplifiers in the circuits 150–154 in response to the address obtained from the address latch 112. After time t40, the control circuit 116 asserts the control signals 172 to latch the data obtained from the array 24 into the latch 158. The latched data is then available on the data path 54 for PortB.

This is only one example and numerous other combinations of sequences are possible. For example, the PortA and PortB accesses may occur at the same time or the PortB access may precede the PortA access in which case the control circuit 116 carries out the PortB access and then the PortA access. The PortA access may be a read and the PortB access a write or visa versa. If the PortA and PortB accesses occur at the same time then the control circuit 116 selects one or the other to be sequenced first to the array 24.

For example, if the PortA access is write, the control circuit 116 asserts the control signals 170 to latch the write data from the data path 34 while the data is valid on the data path 34. Thereafter at time t30, the control circuit 116 asserts the control signals 170 to provide the data from the latch 156 to the circuits 150–154 and asserts the control signals 40 and the control signals 160–164 to write the appropriate rows and columns of the array 24.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A multi-port memory, comprising:
    array having a set of memory cells and a set of access lines for accessing the memory cells;
    port control circuit having a plurality of ports each for obtaining an address via a corresponding address path to the multi-port memory such that the address paths have independent timing, the port control circuit sequencing the addresses to the array one at a time via the access lines;
    input/output circuit for holding a set of data associated with each of the addresses.

2. The multi-port memory of claim 1, wherein the port control circuit comprises:
    set of latches corresponding to the ports, each latch for holding the address carried on the corresponding address path;
    circuit for sequencing the addresses to the array.

3. The multi-port memory of claim 1, wherein the multi-port memory is a dual-port memory.

4. The multi-port memory of claim 1, wherein the input/output circuit includes a set of latches corresponding to the ports, each latch for holding the data obtained from the corresponding port.

5. The multi-port memory of claim 1, wherein the input/output circuit includes a set of latches corresponding to the ports, each latch for holding the data obtained from the array for the corresponding port.

6. The multi-port memory of claim 1, wherein the memory cells are static random access memory cells.

7. A method for accessing an array of memory cells in a multi-port memory, comprising the steps of:
    obtaining an address via each of a set of address paths to the multi-port memory such that the address paths have independent timing;
    sequencing the addresses to the array one at a time via a set of access lines to the array;
    holding a set of data associated with each of the addresses.

8. The method of claim 7, further comprising the step of sensing one or more control signals on each of a set of control paths.

9. The method of claim 7, wherein the step of obtaining comprises the step of latching the address carried on each address path.

10. The method of claim 7, wherein the step of holding includes the step of latching a set of data obtained from a data path.

11. The method of claim 7, wherein the step of holding includes the step of latching a set of data obtained from the array for transfer via a data path.

12. An apparatus for accessing an array of memory cells in a multi-port memory, comprising:
    means for obtaining an address via each of a set of address paths to the multi-port memory such that the address paths have independent timing;
    means for sequencing the addresses to the array one at a time via a set of access lines to the array;
    means for holding a set of data associated with each of the addresses.

13. The apparatus of claim 12, further comprising means for sensing one or more control signals on each a set of control paths.

14. The apparatus of claim 12, wherein the means for obtaining comprises means for latching the address carried on each address path.

15. The apparatus of claim 12, wherein the means for holding includes means for latching a set of data obtained from a data path.

16. The apparatus of claim 12, wherein the means for holding includes means for latching a set of data obtained from the array for transfer via a data path.

17. A multi-port memory, comprising:
    array having a set of memory cells and a set of access lines for accessing the memory cells;
    port control circuit having a first port for obtaining a memory address via a first access path and a second port for obtaining a memory address via a second access path such that the first and second access paths have independent timing, the port control circuit capable of sequencing the memory accesses to the array one at a time via the access lines.

18. The multi-port memory of claim 17, further comprising an input/output circuit for holding a set of data associated with the memory address obtained via the first port and for holding a set of data associated with the memory address obtained via the second port.

19. The multi-port memory of claim 17, wherein the port control circuit obtains the memory address via the first port before the memory address via the second port and in response sequences the memory address obtained via the first port to the array via the access lines and then sequences the memory address obtained via the second port to the array via the access lines.

20. The multi-port memory of claim 17, wherein the port control circuit obtains the memory address via the second port before the memory address via the first port and in response sequences the memory address obtained via the second port to the array via the access lines and then sequences the memory address obtained via the first port to the array via the access lines.

21. The multi-port memory of claim 17, wherein the port control circuit obtains the memory address via the first port substantially contemporaneously with the memory address via the second port and in response sequences the memory address obtained via the first port to the array via the access lines and then sequences the memory address obtained via the second port to the array via the access lines.

22. The multi-port memory of claim 17, wherein the port control circuit obtains the memory address via the first port substantially contemporaneously with the memory address via the second port and in response sequences the memory address obtained via the second port to the array via the access lines and then sequences the memory address obtained via the first port to the array via the access lines.

23. A method for memory access, comprising:
    obtaining a memory address via a first access path and obtaining a memory address via a second access path such that the first and second access paths have independent timing;
    sequencing the memory accesses to an array of memory cells one at a time via a common set of access lines to the memory cells.

24. The method of claim 23, further comprising the step of holding a set of data associated with the memory address obtained via the first access path and holding a set of data associated with the memory address obtained via the second address path.

25. The method port memory of claim 23, wherein the steps of obtaining comprise the steps of obtaining the memory address via the first access path before the memory address via the second access path and wherein the step of sequencing comprises the step of sequencing the memory address obtained via the first access path to the array via the access lines and then sequencing the memory address obtained via the second address path to the array via the access lines.

26. The method memory of claim 23, wherein the steps of obtaining comprise the steps of obtaining the memory address via the second access path before the memory address via the first access path and wherein the step of sequencing comprises the step of sequencing the memory address obtained via the second access path to the array via the access lines and then sequencing the memory address obtained via the first address path to the array via the access lines.

27. The method memory of claim 23, wherein the steps of obtaining comprise the step of obtaining the memory address via the first access path substantially contemporaneously with the memory address via the second access path and wherein the step of sequencing comprises the step of sequencing the memory address obtained via the first access path to the array via the access lines and then sequencing the memory address obtained via the second address path to the array via the access lines.

28. The method memory of claim 23, wherein the steps of obtaining comprise the step of obtaining the memory address via the first access path substantially contemporaneously with the memory address via the second access path and wherein the step of sequencing comprises the step of sequencing the memory address obtained via the second access path to the array via the access lines and then sequencing the memory address obtained via the first address path to the array via the access lines.

* * * * *